United States Patent
Chow et al.

(10) Patent No.: US 7,294,935 B2
(45) Date of Patent: Nov. 13, 2007

(54) INTEGRATED CIRCUITS PROTECTED AGAINST REVERSE ENGINEERING AND METHOD FOR FABRICATING THE SAME USING AN APPARENT METAL CONTACT LINE TERMINATING ON FIELD OXIDE

(75) Inventors: Lap-Wai Chow, South Pasadena, CA (US); James P. Baukus, Westlake Village, CA (US); William M. Clark, Jr., Camarillo, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/768,904

(22) Filed: Jan. 24, 2001

(65) Prior Publication Data

US 2002/0096776 A1   Jul. 25, 2002

(51) Int. Cl.
*H01L 23/52* (2006.01)
*H01L 29/40* (2006.01)

(52) U.S. Cl. ............ 257/774; 257/355; 257/357; 257/382; 257/383; 257/384; 257/48

(58) Field of Classification Search ........... 257/355, 257/357, 774, 382–384, 48
See application file for complete search history.

(56) References Cited

U.S. PATENT DOCUMENTS

| | | | |
|---|---|---|---|
| 3,673,471 A | 6/1972 | Klein et al. ............ 317/235 R |
| 3,946,426 A | 3/1976 | Sanders ........................ 357/71 |
| 4,017,888 A | 4/1977 | Christie et al. ................ 357/54 |
| 4,139,864 A | 2/1979 | Schulman .................... 358/188 |
| 4,164,461 A | 8/1979 | Schilling .............. 204/192 EC |
| 4,196,443 A | 4/1980 | Dingwall ...................... 357/68 |
| 4,267,578 A | 5/1981 | Vetter .......................... 364/709 |
| 4,291,391 A | 9/1981 | Chatterjee et al. .......... 365/184 |
| 4,295,897 A | 10/1981 | Tubbs et al. ................ 148/1.5 |
| 4,314,268 A | 2/1982 | Yoshioka et al. ............. 357/48 |
| 4,317,273 A | 3/1982 | Guterman et al. ............ 29/571 |
| 4,322,736 A | 3/1982 | Sasaki et al. ............... 257/369 |
| 4,374,454 A | 2/1983 | Jochems ....................... 29/571 |
| 4,409,434 A | 10/1983 | Basset et al. ............... 380/265 |
| 4,435,895 A | 3/1984 | Parillo .......................... 29/571 |
| 4,471,376 A | 9/1984 | Morcom et al. .............. 357/71 |
| 4,581,628 A | 4/1986 | Miyauchi et al. ............. 357/71 |

(Continued)

FOREIGN PATENT DOCUMENTS

EP    0 186 855 A2    7/1986

(Continued)

OTHER PUBLICATIONS

Document No. 02237038, dated Dec. 6, 1990, Patent Abstracts of Japan, vol. 014, No. 550 (E-1009).
Document No. 63129647, dated Jun. 2, 1988, Patent Abstracts of Japan, vol. 012, No. 385 (E-668), Oct. 14, 1998.

(Continued)

*Primary Examiner*—Jerome Jackson
*Assistant Examiner*—Joseph Nguyen
(74) *Attorney, Agent, or Firm*—Ladas & Parry

(57) ABSTRACT

Semiconducting devices, including integrated circuits, protected from reverse engineering comprising metal traces leading to field oxide. Metallization usually leads to the gate, source or drain areas of the circuit, but not to the insulating field oxide, thus misleading a reverse engineer. A method for fabricating such devices.

22 Claims, 4 Drawing Sheets

U.S. PATENT DOCUMENTS

| | | | |
|---|---|---|---|
| 4,583,011 A | 4/1986 | Pechar | 307/440 |
| 4,603,381 A | 7/1986 | Guttag et al. | 364/200 |
| 4,623,255 A | 11/1986 | Suszko | 356/389 |
| 4,727,493 A | 2/1988 | Taylor, Sr. | 364/490 |
| 4,766,516 A | 8/1988 | Ozdemir et al. | 361/380 |
| 4,799,096 A | 1/1989 | Koeppe | 357/42 |
| 4,821,085 A | 4/1989 | Haken et al. | 357/67 |
| 4,830,974 A | 5/1989 | Chang et al. | 437/34 |
| 4,939,567 A | 7/1990 | Kenney | 257/383 |
| 4,958,222 A * | 9/1990 | Takakura et al. | 257/659 |
| 4,962,484 A | 10/1990 | Takeshima et al. | 365/226 |
| 4,975,756 A | 12/1990 | Haken et al. | 357/4.1 |
| 4,998,151 A | 3/1991 | Korman et al. | 257/328 |
| 5,030,796 A | 7/1991 | Swanson et al. | 174/52.2 |
| 5,050,123 A | 9/1991 | Castro | 365/53 |
| 5,061,978 A | 10/1991 | Mizutani et al. | 357/30 |
| 5,065,208 A | 11/1991 | Shah et al. | 357/34 |
| 5,068,697 A | 11/1991 | Noda et al. | 357/23.5 |
| 5,070,378 A | 12/1991 | Yamagata | 357/23.5 |
| 5,101,121 A | 3/1992 | Sourgen | 307/465 |
| 5,117,276 A | 5/1992 | Thomas et al. | 357/71 |
| 5,121,089 A | 6/1992 | Larson et al. | 333/107 |
| 5,121,186 A | 6/1992 | Wong et al. | 257/384 |
| 5,132,571 A | 7/1992 | McCollum et al. | 307/465.1 |
| 5,138,197 A | 8/1992 | Kuwana | 307/449 |
| 5,146,117 A | 9/1992 | Larson | 307/465 |
| 5,168,340 A | 12/1992 | Nishimura | 357/376 |
| 5,177,589 A | 1/1993 | Kobayashi et al. | 257/773 |
| 5,202,591 A | 4/1993 | Walden | 307/450 |
| 5,225,699 A | 7/1993 | Nakamura | 257/306 |
| 5,227,649 A | 7/1993 | Chapman | 257/204 |
| 5,231,299 A | 7/1993 | Ning et al. | 257/316 |
| 5,302,539 A | 4/1994 | Haken et al. | 437/41 |
| 5,308,682 A | 5/1994 | Morikawa | 428/195 |
| 5,309,015 A | 5/1994 | Kuwata et al. | 257/659 |
| 5,317,197 A | 5/1994 | Roberts | 257/401 |
| 5,336,624 A | 8/1994 | Walden | 437/34 |
| 5,341,013 A | 8/1994 | Koyanagi et al. | 257/368 |
| 5,345,105 A | 9/1994 | Sun et al. | 257/659 |
| 5,354,704 A | 10/1994 | Yang et al. | 437/52 |
| 5,369,299 A | 11/1994 | Byrne et al. | 257/638 |
| 5,371,390 A | 12/1994 | Mohsen | 257/209 |
| 5,376,577 A | 12/1994 | Roberts et al. | 437/52 |
| 5,384,472 A | 1/1995 | Yin | 257/204 |
| 5,399,441 A | 3/1995 | Bearinger et al. | 428/689 |
| 5,404,040 A | 4/1995 | Hshieh et al. | 257/341 |
| 5,412,237 A | 5/1995 | Komori et al. | 257/306 |
| 5,441,902 A | 8/1995 | Hsieh et al. | 437/34 |
| 5,468,990 A | 11/1995 | Daum | 257/632 |
| 5,475,251 A | 12/1995 | Kuo et al. | 257/316 |
| 5,506,806 A | 4/1996 | Fukushima | 365/195 |
| 5,531,018 A | 7/1996 | Saia et al. | 29/622 |
| 5,539,224 A | 7/1996 | Ema | 257/211 |
| 5,541,614 A | 7/1996 | Lam et al. | 343/792.5 |
| 5,571,735 A | 11/1996 | Mogami et al. | 437/41 |
| 5,576,988 A | 11/1996 | Kuo et al. | 365/185.04 |
| 5,611,940 A | 3/1997 | Zettler | 73/514.16 |
| 5,638,946 A | 6/1997 | Zavracky | 200/181 |
| 5,677,557 A | 10/1997 | Wuu et al. | 257/382 |
| 5,679,595 A * | 10/1997 | Chen et al. | 437/52 |
| 5,719,422 A | 2/1998 | Burr et al. | 257/377 |
| 5,719,430 A | 2/1998 | Goto | 257/403 |
| 5,721,150 A | 2/1998 | Pasch | 437/46 |
| 5,783,846 A | 7/1998 | Baukus et al. | 257/204 |
| 5,821,590 A | 10/1998 | Lee et al. | 257/377 |
| 5,838,047 A | 11/1998 | Yamauchi et al. | 257/372 |
| 5,854,510 A * | 12/1998 | Sur, Jr. et al. | 257/529 |
| 5,866,933 A | 2/1999 | Baukus et al. | 257/368 |
| 5,880,503 A | 3/1999 | Matsumoto et al. | 257/372 |
| 5,888,887 A | 3/1999 | Li et al. | 438/525 |
| 5,895,241 A | 4/1999 | Lu et al. | 438/275 |
| 5,920,097 A | 7/1999 | Horne | 257/368 |
| 5,930,663 A | 7/1999 | Baukus et al. | 438/598 |
| 5,930,667 A | 7/1999 | Oda | 438/622 |
| 5,973,375 A | 10/1999 | Baukus et al. | 257/399 |
| 5,977,593 A * | 11/1999 | Hara | 257/356 |
| 5,998,257 A | 12/1999 | Lane et al. | 438/253 |
| 6,037,627 A | 3/2000 | Kitamura et al. | 257/324 |
| 6,046,659 A | 4/2000 | Loo et al. | 333/262 |
| 6,054,659 A | 4/2000 | Lee et al. | 200/181 |
| 6,057,520 A | 5/2000 | Goodwin-Johansson | 200/181 |
| 6,093,609 A * | 7/2000 | Chuang | 438/286 |
| 6,117,762 A | 9/2000 | Baukus et al. | 438/618 |
| 6,137,318 A | 10/2000 | Takaaki | 326/112 |
| 6,154,388 A | 11/2000 | Oh | 365/185.04 |
| 6,165,861 A * | 12/2000 | Liu et al. | 438/382 |
| 6,215,158 B1 | 4/2001 | Choi | 257/368 |
| 6,255,155 B1 * | 7/2001 | Lee et al. | 438/222 |
| 6,294,816 B1 | 9/2001 | Baukus et al. | 257/368 |
| 6,326,675 B1 * | 12/2001 | Scott et al. | 257/608 |
| 6,365,453 B1 * | 4/2002 | Deboer et al. | 438/253 |

FOREIGN PATENT DOCUMENTS

| | | |
|---|---|---|
| EP | 0 364 769 | 4/1990 |
| EP | 0 463 373 | 1/1992 |
| EP | 0 528 302 A1 | 2/1993 |
| EP | 0 585 601 A1 | 3/1994 |
| EP | 0 764 985 A2 | 3/1997 |
| EP | 0 883 184 A2 | 12/1998 |
| EP | 0 920 057 A2 | 6/1999 |
| EP | 1 193 758 A1 | 4/2002 |
| EP | 1 202 353 A1 | 5/2002 |
| FR | 2486717 | 1/1982 |
| JP | 58-190064 | 11/1983 |
| JP | 61-147551 | 7/1986 |
| JP | 63 129647 A | 6/1988 |
| JP | 02-046762 | 2/1990 |
| JP | 02-237038 | 9/1990 |
| JP | 10-256398 | 9/1998 |
| WO | 98/21734 | 5/1998 |
| WO | 98/57373 | 12/1998 |
| WO | 00/44012 | 7/2000 |

OTHER PUBLICATIONS

Patent Abstracts of Japan, vol. 016, No. 197 (p-1350) May 12, 1992 & JP-A-40 28 092 (Toshiba Corp), abstract.

Fredericksen, T.M., "A Multiple-Layer-Metal CMOS Process," *Intuitive CMOS Electronics*, Revised Edition, Section 5.6, pp. 134-146 (1989).

Hodges and Jackson, *Analysis and Design of Digital Integrated Circuits*, 2nd edition, McGraw-Hill, p. 353 (1988).

Larson, L.E., et al., "Microactuators for GaAs-based Microwave Integrated Circuits," *IEEE*, pp. 743-746 (1991).

Lee, "Engineering a Device for Electron-beam Probing," *IEEE Design and Test of Computers*, pp. 36-49 (1989).

Sze, S.M., ed. *VLSI Technology*, McGraw-Hill, pp. 99, 447, and 461-465 (1983).

Sze, S.M., ed., "Silicides for Gates and Interconnections," *VLSI Technology*, McGraw-Hill, pp. 372-380 (1983).

United Kingdom Examination Report for the corresponding United Kingdom Application No. GB0316906.7, issued on Feb. 10, 2005 (3 pages).

Blythe, et al., "Layout Reconstruction of Complex Silicon Chips," *IEEE Journal of Solid-State Circuits*, pp. 138-145 (Feb. 1993).

Ng, K.K., *Complete Guide to Semiconductor Devices*, McGraw-Hill, Inc., pp. 164-165 (1995).

IBM_TDB, "Double Polysilicon Dynamic Memory Cell with Polysilicon Bit Line," pp. 3828-3831 (Feb. 1979).

IBM_TDB, "Static Ram Double Polysilicon Process," pp. 3683-3686 (Jan. 1981).

* cited by examiner

US 7,294,935 B2

INTEGRATED CIRCUITS PROTECTED AGAINST REVERSE ENGINEERING AND METHOD FOR FABRICATING THE SAME USING AN APPARENT METAL CONTACT LINE TERMINATING ON FIELD OXIDE

I. BACKGROUND OF THE INVENTION

1. Field of the Invention

This invention relates to the field of the prevention of reverse engineering of integrated circuits and/or making such reverse engineering so difficult and time-consuming as to make reverse engineering of integrated circuits non-feasible.

More particularly, this invention relates to using, in order to prevent and/or discourage such reverse engineering, apparent metal contact lines terminating on field oxide.

2. Description of the Related Art

The design and development of semiconductor integrated circuits require thorough understanding of complex structures and processes and involve many man-hours of work requiring high skill, costing considerable sums of money.

In order to avoid these expenses, some developers stoop to the contentious practice of reverse engineering, disassembling existing devices manufactured by somebody else, and closely examining them to determine the physical structure of the integrated circuit, followed by copying the device. Thus, by obtaining a planar optical image of the circuits and by studying and copying them, typically required, product development efforts are circumvented.

Such practices harm the true developer of the product and impairs its competitiveness in the market-place, because the developer had to expend significant resources for the development, while the reverse engineer did not have to.

A number of approaches have been used in order to frustrate such reverse engineering attempts, particularly in the field of semiconductor integrated circuits.

For instance, U.S. Pat. No. 5,866,933 to Baukus, et. al. teaches how transistors in a complementary metal oxide-semiconductor (CMOS) circuit can be connected by implanted, hidden and buried lines between the transistors. This hiding is achieved by modifying the p+ and n+ source/drain masks. The implanted interconnections are further used to make a 3-input AND-circuit look substantially the same as a 3-input OR-circuit.

Furthermore, U.S. Pat. Nos. 5,783,846 to Baukus, et. al. and 5,930,663 to Baukus et. al. teach a further modification in the source/drain implant masks, so that the implanted connecting lines between transistors have a gap inserted, the length of which is approximately the length of the feature size of the CMOS technology being used. These gaps are called "channel blocks."

If the gap is "filled" with one kind of implant (depending on whether the implanted connecting line is p or n), the line conducts; if another kind of implant is used for the gap-filling, the line does not conduct. The reverse engineer must determine connectivity on the basis of resolving the "n" or "p" implant at the minimum feature size of the channel block. In addition, transistor sizes and metal connection routings are modified, in order to deprive the reverse engineer of using clues which can help him find inputs, outputs, gate lines and so on as keys to the circuit functionality.

Practicing the inventions taught in the above-mentioned patents to secure an integrated circuit causes the reverse engineer to perform steps that are not always needed. These steps include: decomposing the circuit layer by layer, careful processing of each layer (which usually must include an etching step) followed by imaging of the layer with exact registration to other layers.

When the reverse engineer is delayering the circuit, he can look also for metal lines running from drain contacts to a poly-gate contact. He does this by looking in the two lowest metal layers for dimples, indicating the presence of metal plugs beneath. Thus, the contact position can be determined, greatly simplifying the reverse engineer's task. Previous patents mentioned above do not address this problem.

Therefore, there still exists a need for an inexpensive, easy-to-implement defensive method which can help to provide the enhanced protection against the reverse engineering of semiconductor integrated circuits, in particular to make the reverse engineer's task of finding real contacts to source and drains very difficult. The present invention provides such a method.

II. SUMMARY OF THE INVENTION

Usual practice of reverse engineering is to try to determine a basic structure of an integrated circuit by identifying metal patterns in the higher level metal layers in the circuit. Metals on these layers route the electric signals between circuit blocks. Once a basic circuit function is determined, rather than look at each next transistor pair, the reverse engineer will utilize the similarity in the upper metal patterns and assume each circuit section showing that pattern is the same.

The main objective of this invention is to make a reverse engineer to examine every connection of every CMOS transistor pair in an integrated circuit. If the reverse engineer is forced to do such detailed examination, he would have to spend so much time and money as to make the attempt of reverse engineering prohibitive and leading to de facto protection against reverse engineering.

In order to achieve this objective, circuit techniques are used to make the pattern of a subsequent circuit section unpredictable and non-repeatable; in other words, these techniques make it incorrect to make a usual assumption that similar metal patterns encompass similar circuit functionality.

The gist of this invention is to guide the reverse engineer to an erroneous assumption by having some metal traces terminate on field oxide located close to a contact region. He will assume, erroneously, that the presence of the plug is to make a real contact to a source or drains when, in fact, there is none.

The field oxide that defines and borders on the contact area is offset so that it covers a portion of the contact area. Then, the dimple and the metal plug are aligned so that the metal plug ends on the field oxide adjacent to the source of drain.

The patterns will appear identical, but these apparent connections are not real connections. The reverse engineer will be led to the wrong conclusion as to the circuit block functionality as a result.

A first aspect of the invention provides a semiconducting device adapted to prevent and/or to thwart reverse engineering, comprising field oxide layer disposed on a semiconductor substrate, a metal plug contact disposed within a contact region and above said field oxide layer, and a metal connected to said metal plug contact.

A second aspect of the invention provides a method for preventing and/or thwarting reverse engineering, comprising steps of providing a field oxide layer disposed on a semiconductor substrate, providing a metal plug contact disposed within a contact region and above said field oxide layer, and connecting a metal to said metal plug contact.

A third aspect of the invention provides a semiconducting device adapted to prevent and/or to thwart reverse engineering, comprising field oxide layer disposed on a semiconductor substrate, a metal plug contact disposed outside a contact region and above said field oxide layer, and a metal connected to said metal plug contact.

A fourth aspect of the invention provides method for preventing and/or thwarting reverse engineering, comprising steps of providing a field oxide layer disposed on a semiconductor substrate, providing a metal plug contact disposed outside a contact region and above said field oxide layer and connecting a metal to said metal plug contact.

III. BRIEF DESCRIPTION OF THE DRAWINGS

The features and advantages of the present invention will become better understood with regard to the following description, appended claims, and accompanying drawings where FIG. 1 schematically shows a prior art field effect transistor that could be part of a CMOS integrated circuit.

FIG. 1(a) schematically shows how a contact plug is usually located relative to field oxide in (also prior art).

FIG 1(b) schematically shows relative locations of the metal plug and the metallization layer.

IV. DETAILED DESCRIPTION OF THE INVENTION

Figure 1A:
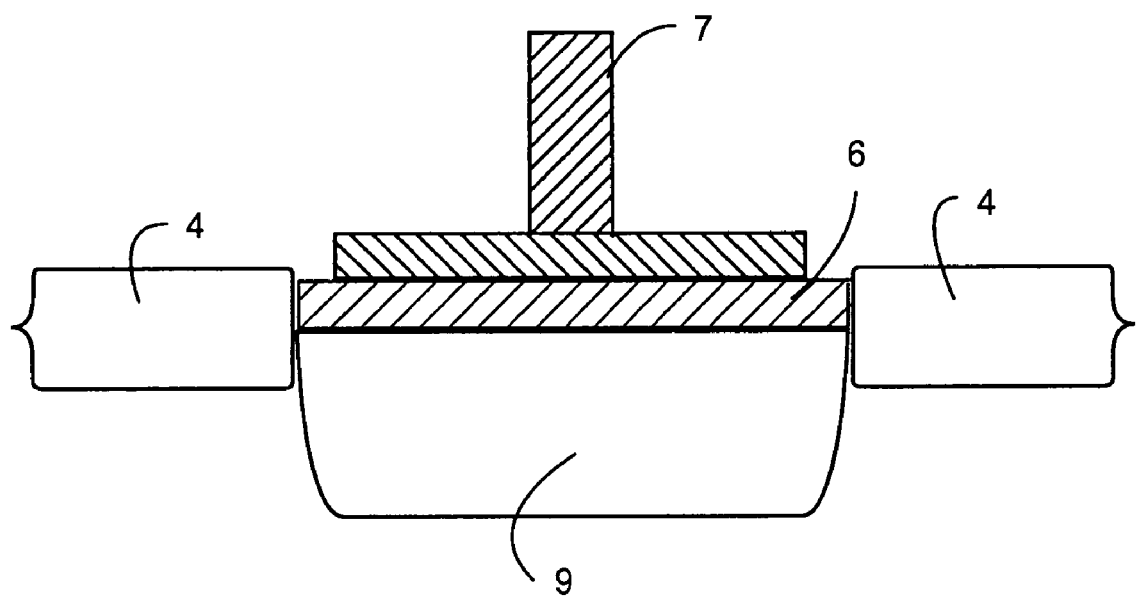

This invention can be used on any semiconducting device utilizing, preferably, CMOS integrated circuits or bipolar silicon circuits.

FIG. 1 shows general architecture of some elements of a typical field effect transistor within a CMOS integrated circuit 100. The circuit 100 comprises a source 1, a drain 2, gate oxide 3, an insulating field oxide 4, preferably, silicon oxide. It further comprises a layer of polysilicon ("poly") 5, of silicide 6, and a contact plug 7. The circuit 100 is disposed on a semiconducting substrate 8.

FIG. 1(a) demonstrates how a contact plug 7 is positioned relative to field oxide 4 in prior art. The contact plug 7 is disposed over a layer of silicide 6 and over the active area 9. In FIG. 1, such a contact could be placed over both the source 1 and the drain 2.

Figure 1B:
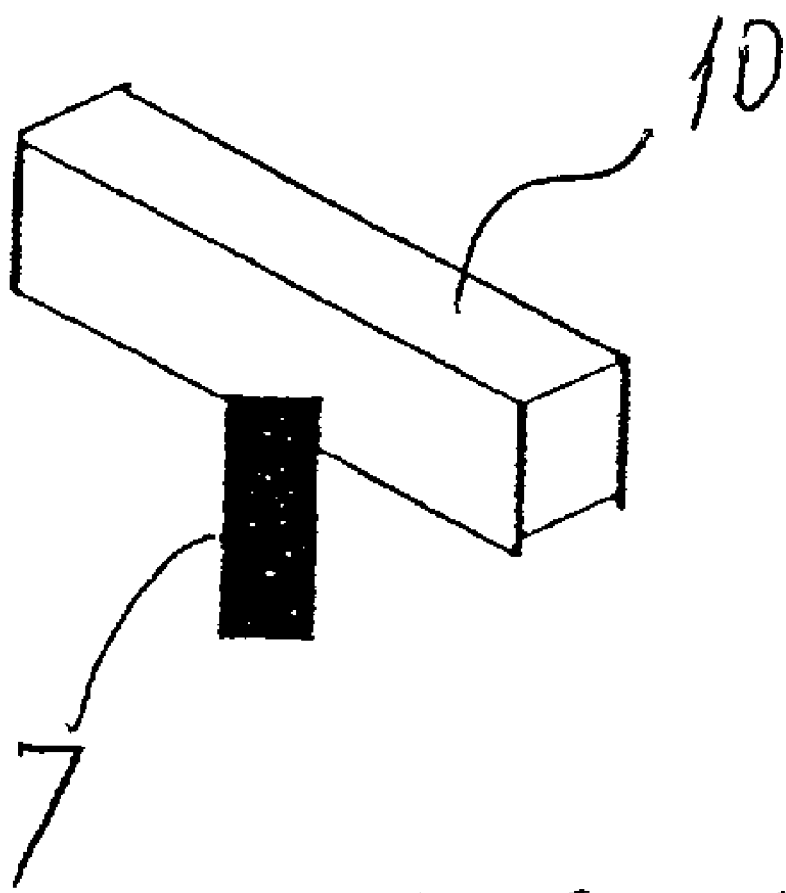

FIG. 1(b) shows that the contact plug 7 is disposed orthogonally to the plane of metallization layer 10. Such relative orientation of the contact plug 7 is present both in prior art and in this invention.

Seeing metallization 10, a reverse engineer will presume that it leads to either the source or the drain 2, or the gate. He will be misled and confused when the metal leads to the field oxide 4, as shown on FIG. 2 as a preferred embodiment of this invention.

Figure 2:
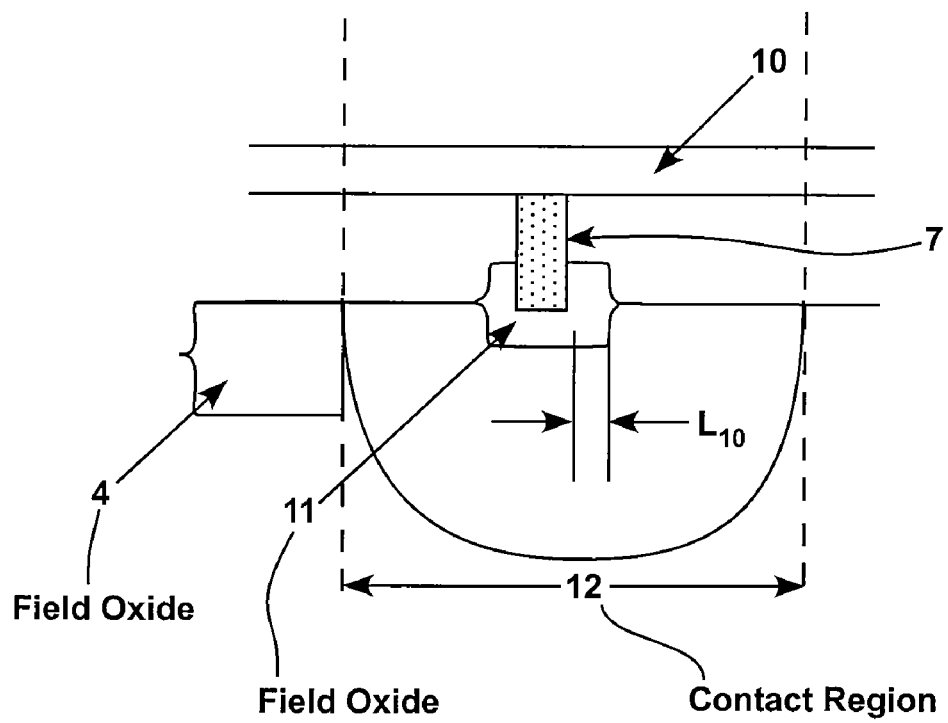
FIG. 2 is a schematic diagram showing a preferred embodiment of this invention.

FIG. 2 shows a contact plug 7 and the contact is meant to be to the right of field oxide 4. Field oxide 4 is deposited over a portion of the contact region, and the metal plug 7 which would have usually been placed to end on the contact region ends up on the field oxide 4 region instead.

The plug 7 typically has a substantially smaller area than the contact region.

$L_{10}$ is the overlap area between the oxide region, the normal contact region and the placing of the plug 7. The diameter of the plug 7 is preferably not larger than the size of the minimum feature. $L_{10}$ can be of any size, specified by the fabrication vendor, and is preferably 10% larger than the size of the minimum feature. A preferred contact dimension is up to about three times of the via size.

Figure 3:
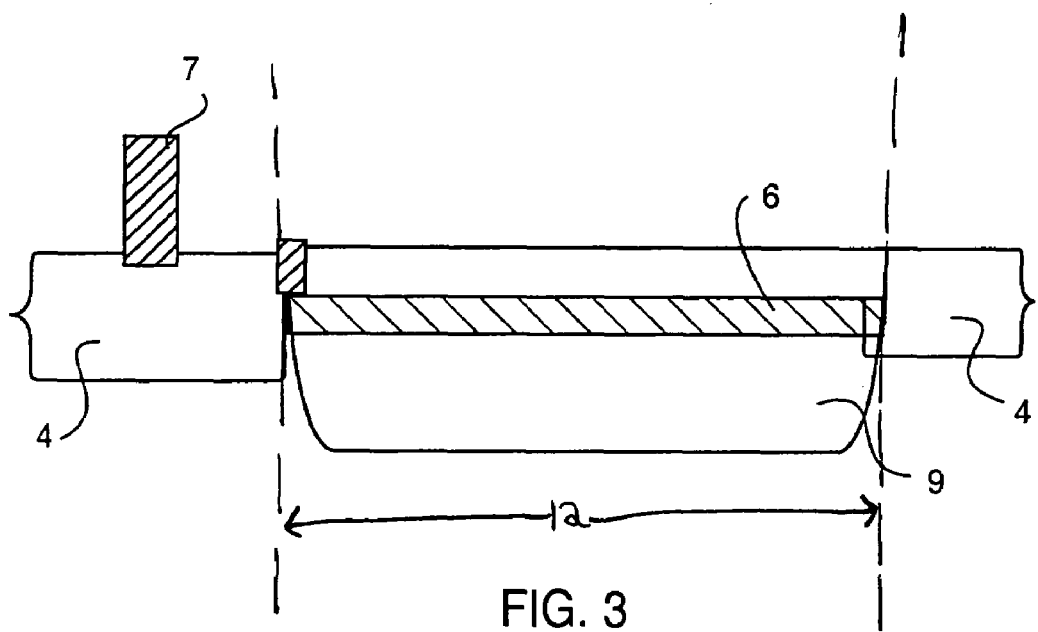
FIG. 3 is a schematic diagram showing an alternative embodiment of this invention.

Alternatively, the plug 7 could also end on an oxide layer 4 deposited somewhere in the circuit where there would not be a contact. FIG. 3 shows such embodiment. As can be seen from FIG. 3, contact plug 7 does not extend into active area 9. Instead it ends on oxide layer 4.

Having described the invention in connection with several embodiments thereof, modification will now suggest itself to those skilled in the art. As such, the invention is not to be limited to the described embodiments except as required by the appended claims.

We claim:

1. A semiconducting device adapted to prevent and/or to thwart reverse engineering, comprising:
   (a) a field oxide layer disposed on a semiconductor substrate having an opening defining a contact region of the semiconductor substrate;
   (b) a metal plug contact disposed above a section of field oxide located within said contact region, wherein said metal plug contact contacts said field oxide section, and wherein said field oxide section electrically isolates said metal plug contact from said contact region; and
   (c) a metal connected to said metal plug contact.

2. The device as claimed in claim 1, wherein said semiconducting device comprises integrated circuits.

3. The device as claimed in claim 2, wherein said integrated circuits further comprise complementary metal oxide-semiconductor integrated circuits and bipolar silicon-based integrated circuits.

4. The device as claimed in claim 1, wherein said field oxide layer further comprises silicon oxide.

5. The device as claimed in claim 1, wherein said field oxide section has an uppermost side, said metal plug contact being disposed on said uppermost side of said field oxide layer.

6. A method for preventing and/or thwarting reverse engineering, comprising:
   (a) providing a field oxide layer disposed on a semiconductor substrate having an opening defining a contact region of the semiconductor substrate;
   (b) providing a metal plug contact disposed above a section of field oxide located within said contact region, wherein said metal plug contact contacts said field oxide section, and wherein said field oxide section electrically isolates said metal plug contact from said contact region; and
   (c) connecting a metal to said metal plug contact.

7. The method as claimed in claim 6, wherein said semiconducting device comprises integrated circuits.

8. The method as claimed in claim 7, wherein said integrated circuits further comprise complementary metal oxide-semiconductor integrated circuits.

9. The method as claimed in claim 6, wherein said field oxide layer further comprises silicon oxide.

10. The method as claimed in claim 6, wherein said field oxide section has an uppermost side, said metal plug contact being disposed on said uppermost side of said field oxide layer.

11. A semiconducting device adapted to prevent and/or to thwart reverse engineering, comprising:
(a) a field oxide layer disposed on a semiconductor substrate having an opening defining a contact region of the semiconductor substrate;
(b) a metal plug contact having a first surface and a second surface opposite said first surface, wherein said second surface of said metal plug contact is disposed above a section of field oxide located adjacent said contact region and in contact with a dielectric material, wherein no metal is electrically connected with said contact region; and
(c) a metal connected to said first surface of said metal plug contact.

12. The device as claimed in claim 11, wherein said semiconducting device comprises integrated circuits.

13. The device as claimed in claim 12, wherein said integrated circuits further comprise complementary metal oxide-semiconductor integrated circuits and bipolar silicon-based integrated circuits.

14. The device as claimed in claim 11, wherein said field oxide layer further comprises silicon oxide.

15. The device as claimed in claim 11, wherein said field oxide section has an uppermost side, said metal plug contact being disposed on said uppermost side of said field oxide layer.

16. The device of claim 11, wherein said field oxide layer comprises said dielectric material.

17. A method for preventing and/or thwarting reverse engineering, comprising:
(a) providing a field oxide layer disposed on a semiconductor substrate having an opening defining a contact region of the semiconductor substrate;
(b) providing a metal plug contact having a first surface and a second surface opposite said first surface, wherein said second surface of said metal plug contact is disposed above a section of field oxide located adjacent said contact region and in contact with a dielectric material, wherein no metal is electrically connected with said contact region; and
(c) connecting a metal to said first surface of said metal plug contact.

18. The method as claimed in claim 17, wherein said semiconducting device comprises integrated circuits.

19. The method as claimed in claim 18, wherein said integrated circuits further comprise complementary metal oxide-semiconductor integrated circuits.

20. The method as claimed in claim 17, wherein said field oxide layer further comprises silicon oxide.

21. The method as claimed in claim 17, wherein said field oxide section has an uppermost side, said metal plug contact being disposed on said uppermost side of said field oxide layer.

22. The method of claim 17, wherein said field oxide layer comprises said dielectric material.

* * * * *